(12) United States Patent
Korb

(10) Patent No.: US 7,291,221 B2
(45) Date of Patent: Nov. 6, 2007

(54) ELECTROMAGNETIC PUMPING OF LIQUID SILICON IN A CRYSTAL GROWING PROCESS

(75) Inventor: Harold W Korb, Town and Country, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 327 days.

(21) Appl. No.: 11/027,360

(22) Filed: Dec. 30, 2004

(65) Prior Publication Data

US 2006/0144320 A1 Jul. 6, 2006

(51) Int. Cl.
*C30B 15/20* (2006.01)
(52) U.S. Cl. .............................. 117/30; 117/15; 117/32; 117/917
(58) Field of Classification Search ................. 117/30, 117/32, 917, 15
See application file for complete search history.

(56) References Cited

U.S. PATENT DOCUMENTS

| 4,436,577 | A | 3/1984 | Frederick et al. |
| 4,592,895 | A | 6/1986 | Matsutani et al. |
| 4,617,173 | A | 10/1986 | Latka |
| 4,659,423 | A | 4/1987 | Kim et al. |
| 4,830,703 | A | 5/1989 | Matsutani |
| 4,849,188 | A | 7/1989 | Takasu et al. |
| 5,178,720 | A | 1/1993 | Frederick |
| 5,653,799 | A | 8/1997 | Fuerhoff |
| 5,665,159 | A | 9/1997 | Fuerhoff |
| 5,846,318 | A | 12/1998 | Javidi |
| 5,871,578 | A | 2/1999 | Lino et al. |
| 5,882,402 | A | 3/1999 | Fuerhoff |
| 5,911,823 | A | 6/1999 | Sonoda |
| 6,535,092 | B1 | 3/2003 | Hurley et al. |

FOREIGN PATENT DOCUMENTS

| EP | 0 194 051 A1 | 9/1986 |
| JP | 60 011297 | 1/1985 |
| WO | WO 89/08731 A1 | 9/1989 |

OTHER PUBLICATIONS

Watanabe et al., "Flow and Temperature Field in Molten Silicon During Czochralski Crystal Growth in a Cusp Magnetic Field," Journal of Crystal Growth, Oct. 1, 1998, pp. 402-412, vol. 193, No. 3, Amsterdam, NL.
Hirata et al., "Homogeneous Increase in Oxygen Concentration in Czochralski Silicon Crystal by a Cusp Magnetic Field," Journal of Crystal Growth, Dec. 1, 1989, pp. 777-781, vol. 98, No. 4, Amsterdam, NL.
International Search report dated Apr. 6, 2006 for PCT/US2005/043016, 4 pages.

*Primary Examiner*—Felisa C. Hiteshew
(74) *Attorney, Agent, or Firm*—Senniger Powers

(57) ABSTRACT

A method and system for use in combination with a crystal growing apparatus for growing a monocrystalline ingot according to a Czochralski process. The crystal growing apparatus has a heated crucible including a semiconductor melt from which the ingot is pulled. The ingot is grown on a seed crystal pulled from the melt. A time varying external magnetic field is imposed on the melt during pulling of the ingot. The magnetic field is selectively adjusted to produce pumping forces in the melt to control a melt flow velocity while the ingot is being pulled from the melt.

20 Claims, 12 Drawing Sheets

TOP VIEW OF CRUCIBLE

SIDE VIEW OF CRUCIBLE

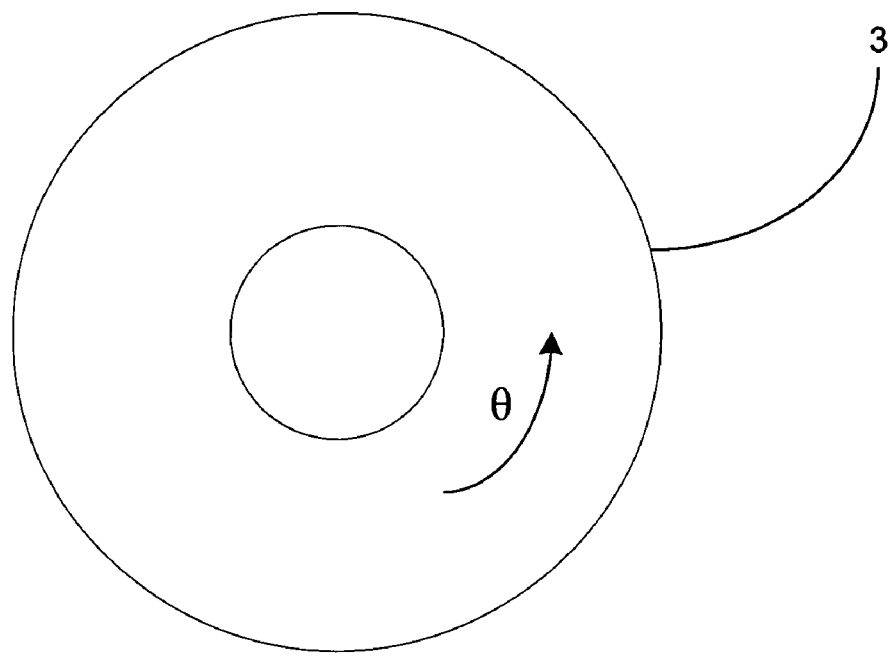
FIGURE 1A - TOP VIEW OF CRUCIBLE
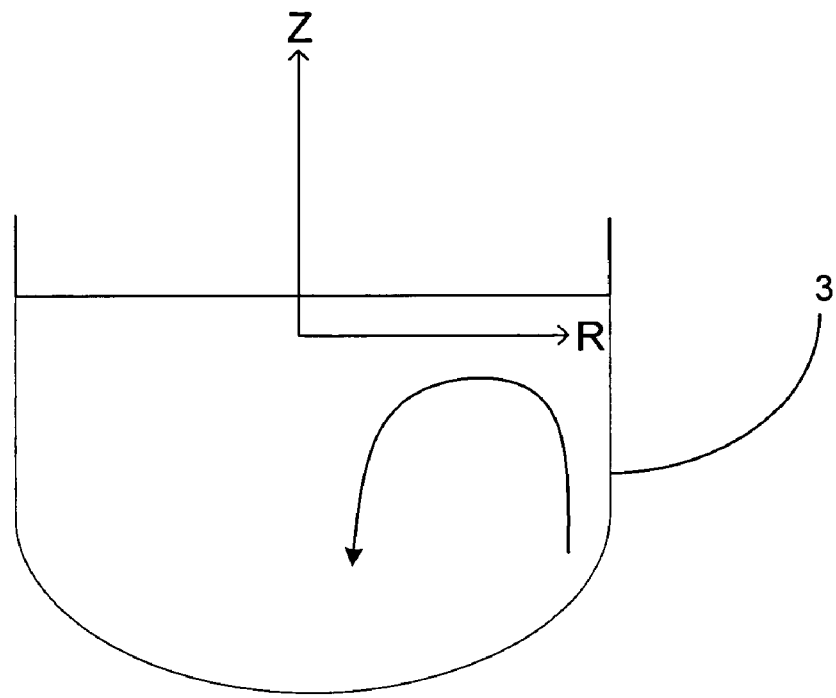
FIGURE 1B - SIDE VIEW OF CRUCIBLE

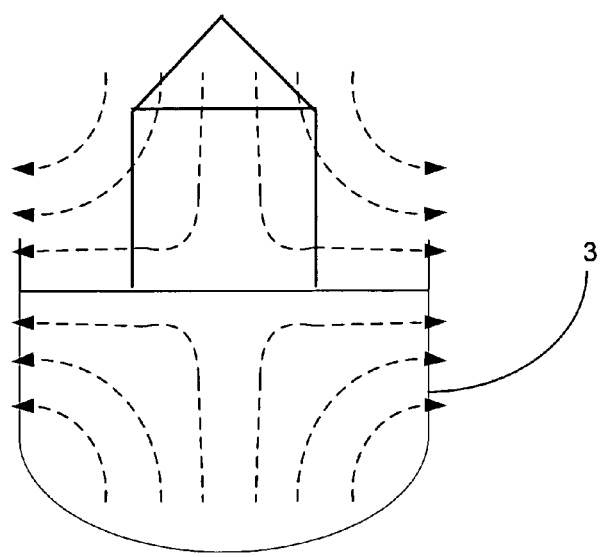
FIGURE 4A
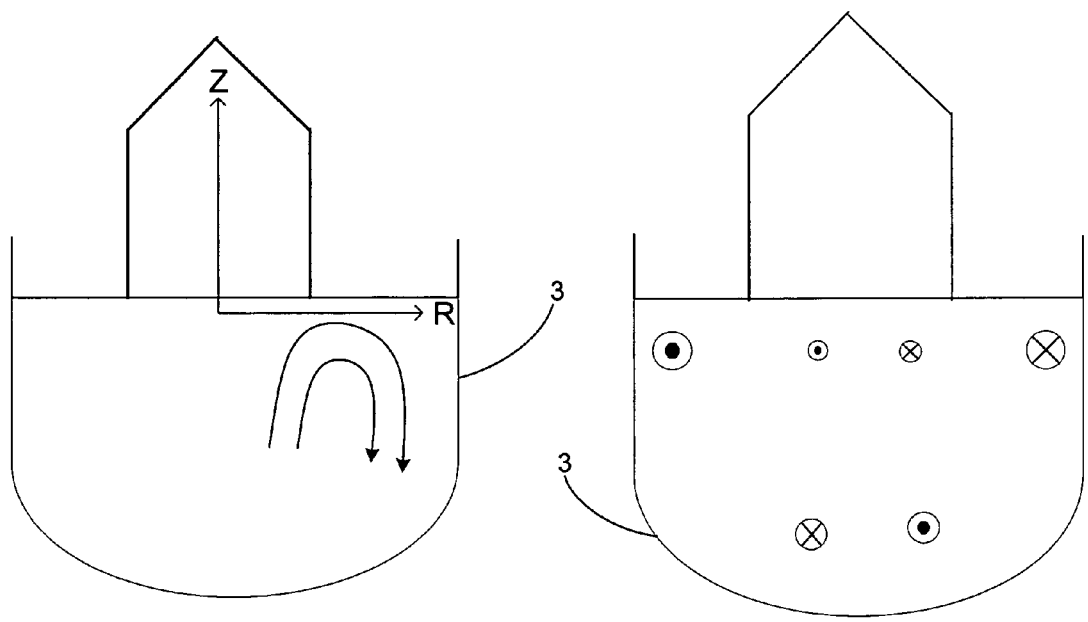
FIGURE 4B                    FIGURE 4C

ELECTROMAGNETIC PUMPING OF LIQUID SILICON IN A CRYSTAL GROWING PROCESS

FIELD OF THE INVENTION

The present invention generally relates to producing semiconductor grade single crystal silicon that can be used in the manufacture of electronic components and the like. More particularly, the present invention relates to a system and method for controlling melt flow by producing pumping forces in the melt using a time-varying magnetic field.

BACKGROUND OF THE INVENTION

Single crystal silicon, which is the starting material in most processes for fabricating semiconductor electronic components, is commonly prepared according to the so-called Czochralski process. In this process, polycrystalline silicon, or polysilicon, is charged to a crucible and melted, a seed crystal is brought into contact with the molten silicon, and a single crystal ingot is grown by relatively slow extraction. After formation of a neck is complete, decreasing the pulling rate and/or the melt temperature enlarges the diameter of the crystal until a desired or target diameter is reached. The generally cylindrical main body of the crystal, which has an approximately constant diameter, is then grown by controlling the pull rate and the melt temperature while compensating for the decreasing melt level. Near the end of the growth process but before the crucible is emptied of molten silicon, the crystal diameter is gradually reduced to form an end-cone. Typically, increasing the crystal pull rate and heat supplied to the crucible forms the end-cone. When the diameter becomes small enough, the crystal is then separated from the melt.

As in known in the art, molten silicon (at about 1420 degrees Celsius (° C.)) will dissolve the surface of a silica ($SiO_2$) crucible containing the melt. Some of the dissolved silica evaporates from the surface of the melt as SiO (silicon monoxide) while some of the dissolved silica becomes incorporated into the growing crystal. The remainder of the dissolved silica remains in the melt. In this manner, the crucible containing the silicon melt acts as a source of oxygen that is found in silicon crystals grown by the conventional Czochralski technique.

Oxygen in the silicon crystal may have both favorable and unfavorable effects. In the various heat treatment processes during the manufacture of various electrical devices, the oxygen in the crystal may cause crystal defects such as precipitates, dislocation loops, and stacking faults or it may cause electrically active defects resulting in devices with inferior performance characteristics. The solid solution of oxygen in the crystal, however, increases the mechanical strength of silicon wafers, and the crystal defects may improve the yield of conforming products by entrapping contaminants of heavy metals. Accordingly, oxygen content of the silicon crystal is an important factor for product quality that should be carefully controlled in accordance with the ultimate application for the silicon wafers.

The oxygen concentration in a conventional silicon crystal grown under Czochralski conditions prevalent in the industry varies along the length of the crystal. For example, the concentration is typically higher at the seed end than in the middle and/or at the bottom or tang end of the crystal. In addition, oxygen concentration typically varies along the radius of a cross-sectional slice of the crystal.

To address this oxygen control problem, attention has been given to the use of magnetic fields to stabilize convective flows in metal and semiconductor melts for controlling oxygen concentration and radial distribution to remove dopant striation, etc. For example, Lorentz forces, which can be generated in a conductive melt as a function of an induced current and an applied magnetic field may be used to dampen natural convective flow and turbulence. Convective flow or convection refers to the process of heat transfer in a liquid by the movement of the liquid itself.

In general, there are two types of convection: natural convention and forced convection. Natural convection occurs when the movement of the melt is due, for example, to density gradients arising from the presence of heaters. Forced convection occurs when the movement of the melt is due to an external agent such as rotation of the crucible and/or crystal. In the normal Cz process, the melt flow is controlled by the motion of the crucible and the crystal being grown, and by the heat flow in the system. Because the melt is at a high temperature (>1412 C) and there can be large heat fluxes, the temperature gradients in the melt can be large, so thermal convection plays a large role in determining the melt flow, Melt flow in an axisymmetric crystal puller can be described using the components of cylindrical coordinate system (e.g., r, θ, z). For example, forced convection resulting from rotating a crucible 3 generally produces movement of the melt azimuthally in the θ direction (see FIG. 1A), and natural convection generally produces a global thermal convective roll in which melt moves radially in the r direction and vertically in the z direction (see FIG. 1B). As known in the art, and as described in more detail below, the direction of movement of the conductive liquid (i.e., melt) and the shape of the magnetic field being applied to the melt determine the direction of an electric field and/or electric current that will be induced in the melt. When an electric charge (e.g., current) moves in a magnetic field a force will act on that moving charge (i.e., Lenz's Law). In view of these principles, various magnetic field configurations have been used to generate forces in a silicon melt to stabilize convective flows, control oxygen concentration, and to remove dopant striation, etc during a crystal growing process.

There are three conventional types of magnetic field configurations used to stabilize convective flows in conductive melts, namely, axial, horizontal, and cusped.

The axial (or vertical) magnetic field configuration (e.g., see FIG. 2A) has a magnetic field parallel to the crystal-growth direction. In this configuration, movement of the melt in the θ direction induces an electric field in the r direction, but minimal if any current can flow in the melt. However, movement of the melt in the r-z plane as illustrated in FIG. 1B induces currents in the θ direction that flow counterclockwise near the top of the melt and clockwise near the bottom of the melt (e.g., see FIG. 2B). Please note that an "X" appearing on the right side of crucible and a corresponding "." appearing on the left side indicates a counter clockwise direction as viewed from the top of crucible, and an "X" appearing on the left side of crucible and a corresponding "." appearing on the right side indicates a clockwise direction as viewed from the top of the crucible. Since minimal current is induced as a result of movement of the melt in the θ direction, there are minimal, if any, forces produced in the melt to retard melt flow in the θ direction. However, the current induced in the melt as a result of convective flow in the r-z plane produces forces in the melt that retard the melt flow which produced it.

In the horizontal (or transverse) magnetic field configuration (see FIG. 3), two magnetic poles (not shown) are placed in opposition to generate a magnetic field perpendicular to the crystal-growth direction. The horizontal configuration has the advantage of efficiency in damping a convective flow at the melt surface. But its non-uniformity both axially and radially and the complex and bulky setup introduce additional design consideration when applying the horizontal magnetic field configuration in large diameter Czochralski growth processes. In this configuration, the retarding forces are not axisymmetric, so the azimuthal symmetry of the system will be lost.

The cusped magnetic field configuration (e.g., see FIG. 4A) provides some advantages over of the axial and horizontal magnetic field configurations. A pair of coils (not shown) placed coaxially above and below a melt-solid interface and operated in an opposed current mode generates a magnetic field that has a purely radial field component near the melt surface and a purely axial field component near the center of the melt. In this manner, the cusped magnetic field configuration attempts to preserve the azimuthal symmetry at the interface between the melt and the crystal. As used herein, azimuthal symmetry refers to a property having the same values independent of azimuthal position, while having different values at different radial positions. In this configuration, movement of the melt in the θ direction induces an electric field that causes current to flow downward at the edge of the melt and upward in the center (see FIG. 4B), and movement of the melt in the r-z plane as illustrated in FIG. 1B induces currents in the θ direction that flow in counterclockwise direction near the top of the melt and a clockwise direction near the bottom of the melt (see FIG. 4C). The currents induced in the melt as a result of melt flow in the θ direction and r-z plane each produce forces in the melt. The forces produced by the induced electrical currents retard the melt flow which produced the respective currents.

As these conventional magnetic fields are generally limited to retarding melt flow, an improved control of the crystal growth process is desired to address the inability of these conventional magnetic field configurations to selectively generate forces in the melt to accelerate melt flow.

SUMMARY OF THE INVENTION

The invention meets the above needs and overcomes one or more deficiencies in the prior art by providing a system and method for applying a time-varying magnetic field to a melt to generate pumping forces in the melt to control the melt flow during the growth process on both short-term and long-term scales. By influencing the flow of liquid silicon in the Czochralski (Cz) crystal growth process, both heat and matter transfer in the melt can be controlled, and, therefore determine the composition and properties of the crystal grown from the melt, as well as the growth process itself. Moreover, the invention provides the desired melt flow control with improved efficiency, flexibility, and capability that combine the benefits from the three conventional magnetic field configurations while providing additional advantages.

In accordance with one aspect of the invention, a method is provided for controlling crystal growth in a crystal growing apparatus, The crystal growing apparatus having a heated crucible containing a semiconductor melt from which a monocrystalline ingot is grown according to a Czochralski process. The ingot being grown on a seed crystal pulled from the melt. The method includes applying a magnetic field to the melt that affects convection in the melt. The method also includes sensing a growth parameter of the ingot being pulled from the melt. The method also includes comparing the sensed growth parameter to a target growth parameter to determine a power adjustment parameter. The method further includes varying the magnetic field while the ingot is being pulled from the melt as a function of the determined power adjustment parameter to produce a pumping force in the melt to change a velocity of convective flow in the melt.

In accordance with another aspect of the invention, a method is provided for controlling crystal growth in a crystal growing apparatus, The crystal growing apparatus having a heated crucible containing a semiconductor melt from which a monocrystalline ingot is grown according to a Czochralski process. The crystal growing apparatus also having first and second coils energized to generate a magnetic field applied to the melt. The ingot being grown on a seed crystal pulled from the melt. The method includes storing a current profile. The current profile defines currents for energizing the first and second coils as a function of a length of the ingot. The method also includes energizing the first and seconds coils with first and second currents, respectively, defined by the current profile to produce a magnetic field applied to the melt. The method further includes varying the first and second currents according to the stored current profile. Varying the first and second currents causes the magnetic field applied to the melt to produce a pumping force in the melt. The pumping force changes a velocity of convective flow in the melt In accordance with another aspect of the invention, a method is provides for correcting a loss of zero dislocation growth in a silicon crystal being grown in a crystal growing apparatus. The crystal growing apparatus has a heated crucible containing a semiconductor melt from which a monocrystalline ingot is grown according to a Czochralski process. The crystal growing apparatus also having first and second coils energized to generate a magnetic field applied to the melt. The ingot being grown on a seed crystal pulled from the melt. The method includes storing a current profile. The current profile defines, as a function of ingot length, a first current having a first phase for energizing the first coil and a second current having a second phase for energizing the second coil. The first phase of the first current being out-of-phase with the second phase of the second current. The method also includes energizing the first and second coils with the first and second currents, respectively, defined by the current profile to produce a magnetic field applied to the melt. The method also includes varying the first and second currents according to the stored current profile. Varying the first and second currents causes the magnetic field applied to the melt to produce a pumping force in the melt, and the pumping force changes a velocity of convective flow in the melt.

Alternatively, the invention may comprise various other methods and apparatuses.

Other features will be in part apparent and in part pointed out hereinafter.

BRIEF DESCRIPTION OF THE DRAWINGS

FIGS. 1A and 1B illustrate directions of exemplary melt flows in a crucible resulting from forced and natural convection, respectively.

FIG. 4A is a block diagram illustrating a cusped-shaped magnetic field being applied to a crucible containing a melt in crystal growing apparatus with the melt flow shown in FIGS. 1A and 1B, respectively.

FIGS. 4B and 4C illustrate the direction currents induced in the melt for the magnetic field configuration shown in FIG. 4A.

DETAILED DESCRIPTION OF THE INVENTION

Embodiments of the present invention provide a control system that improves a global melt flow pattern in a silicon melt during a Czochralski crystal growing process. More specifically, a time-varying (i.e., dynamic) magnetic field is applied to the melt to generate upward or downward pumping forces in the melt. Advantageously, these pumping forces can be used to increase or decrease a velocity of the melt flow as desired. According to one embodiment of the invention, the control system has two modes of operation in which the pumping forces can be generated in the melt to achieve a desired effect (i.e., increase or decrease) on the melt flow velocity. In a first mode of operation, the magnetic field applied to the melt is varied for period of time and is responsive to a control parameter such as diameter to generate a pumping force in the melt that increases or decreases melt flow velocity. In a second mode of operation, the magnetic field applied to the melt can be varied throughout the crystal growing process to generate a pumping force in the melt that increases or decreases melt flow velocity until a steady state velocity is achieved.

Figure 5:
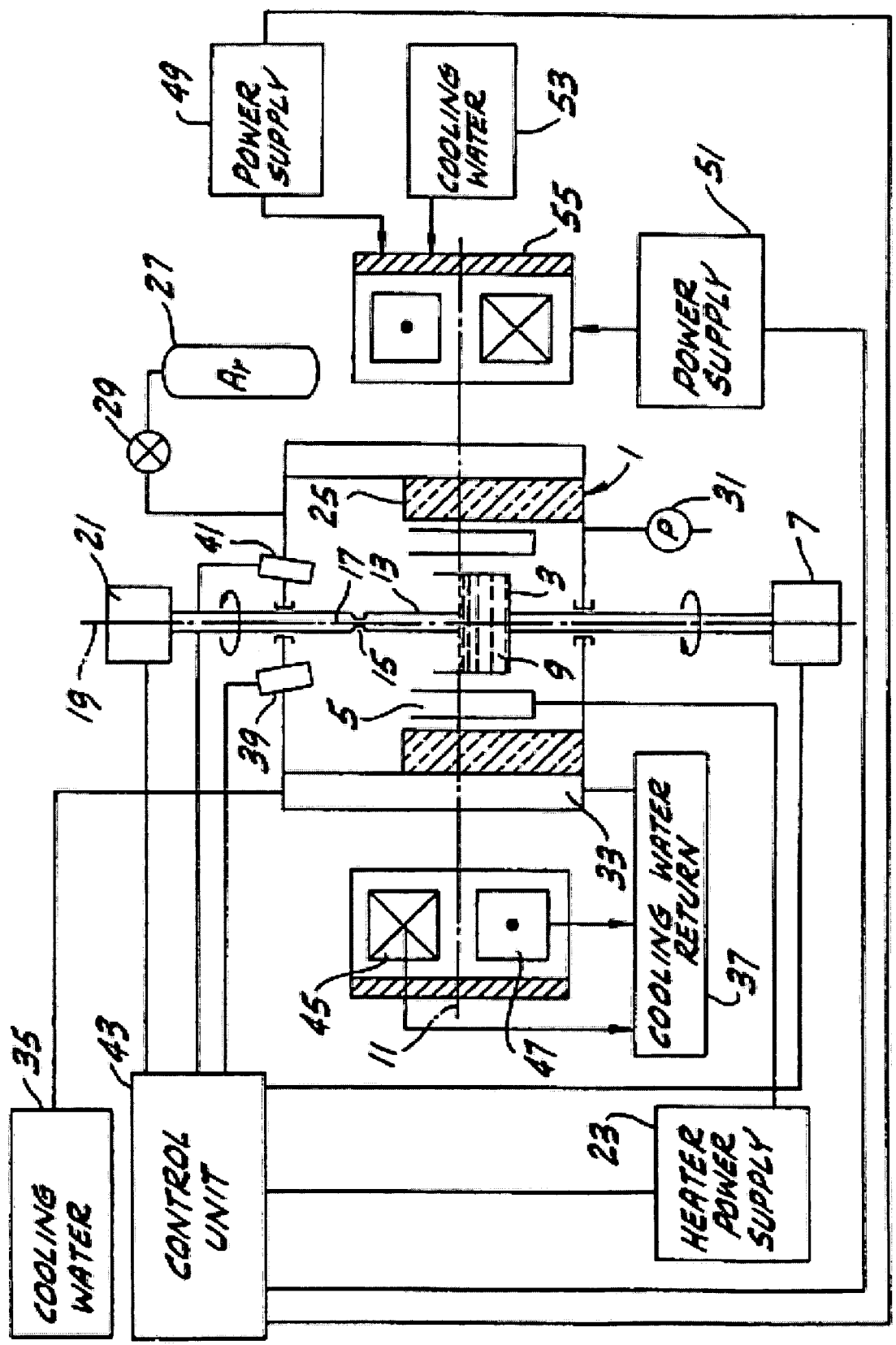
FIG. 5 is an illustration of a crystal growing apparatus according to an embodiment of the present invention for controlling the crystal growing apparatus.
Figure 7A:
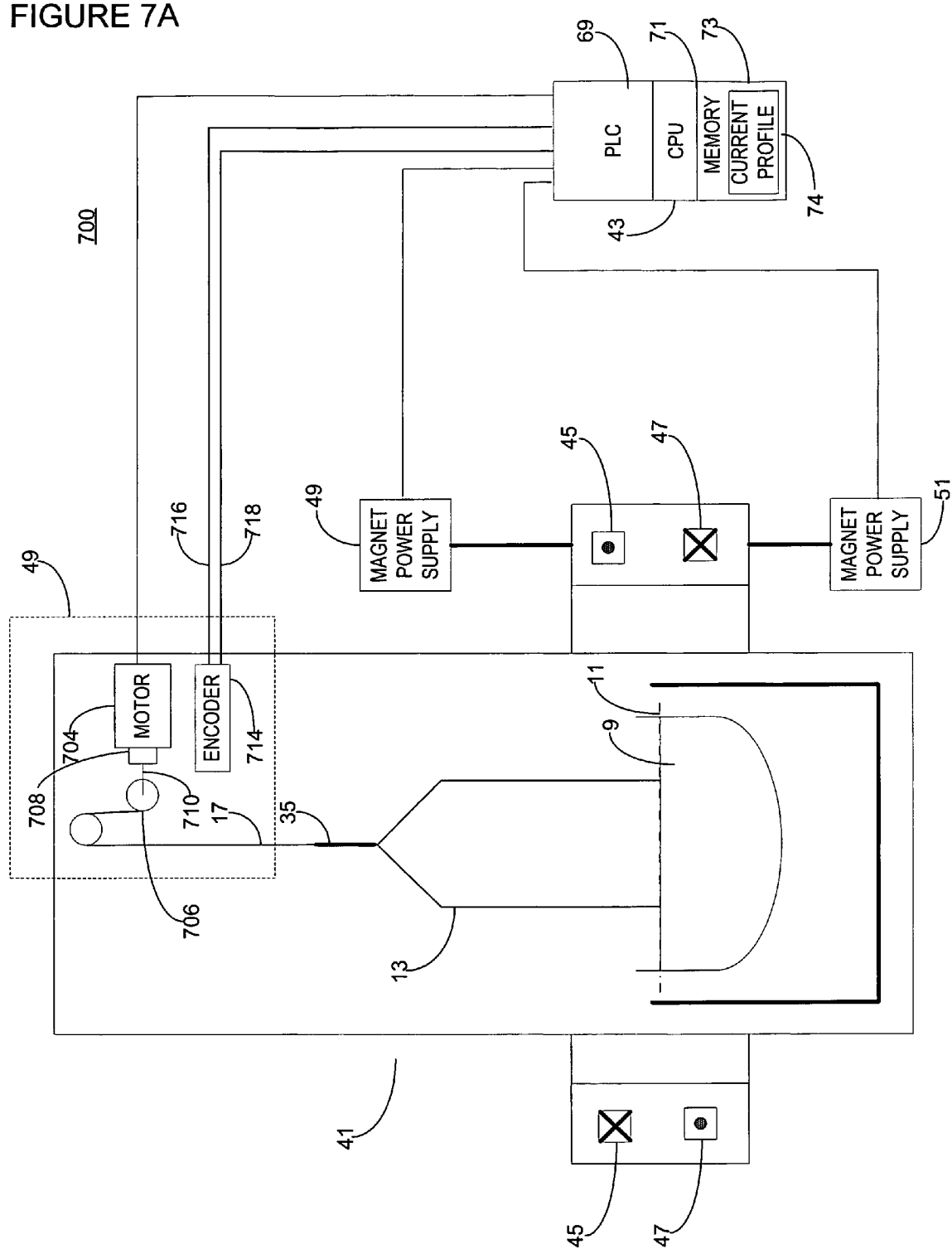
FIG. 7A is a block diagram illustrating components of a crystal growing apparatus control system configured for applying a time-varying magnetic field to a melt throughout the crystal growing process according to another preferred embodiment of the invention.

Referring now to FIG. 5, a system is shown for use with a Czochralski crystal growth apparatus in accordance with embodiments of the present invention. In general, the crystal growing apparatus includes a vacuum chamber 1 enclosing a crucible 3. Within the crucible 3 is a silicon melt 9 having a melt level 11. In operation, the apparatus pulls a single crystal 13, starting with a seed crystal 15 attached to a pull shaft or cable 17, from the melt. Referring briefly to FIG. 7A, if a cable 17 is used, one end of the pull shaft or cable 17 is connected by way of a pulley (not shown) to a drum and the other end is connected to a chuck (not shown) that holds the seed crystal 15 from which the crystal 13 is grown.

Heating means such as a resistance heater 5 surrounds crucible 3. During heating and crystal pulling, a crucible drive unit (e.g., motor) 7 rotates crucible 3, for example, in the clockwise direction as indicated by the arrow. The crucible drive unit 7 may also raise and/or lower crucible 3 as desired during the growth process.

Crucible 3 and single crystal 13 have a common axis of symmetry 19. Crucible drive unit 7 can raise crucible 3 as the melt 9 is depleted to maintain its level 11 at a desired height. A crystal drive unit 21 similarly rotates pull shaft or cable 17 in a direction opposite the direction in which crucible drive unit 7 rotates crucible 3 (e.g., counter-rotation). In embodiments using iso-rotation, the crystal drive unit 21 may rotate pull shaft or cable 17 in the same direction in which crucible drive unit 7 rotates crucible 3 (e.g., in the clockwise direction). In addition, crystal drive unit 21 raises and lowers the crystal 13 relative to melt level 11 as desired during the growth process.

According to the Czochralski single crystal growth process, a quantity of polycrystalline silicon, or polysilicon, is charged to crucible 3. A heater power supply 23 energizes the resistance heater 5, and insulation 25 lines the inner wall of the vacuum chamber 1. A gas supply (e.g., a bottle) 27 feeds argon gas to the vacuum chamber 1 via a gas flow controller 29 as a vacuum pump 31 removes gas from vacuum chamber 1. A chamber cooling jacket 33, which is fed with cooling water from a reservoir 35, surrounds the vacuum chamber 1. The cooling water is then drained to a cooling water return manifold 37. Typically, a temperature sensor such as a photocell 39 (or pyrometer) measures temperature of the melt at its surface, and a diameter transducer 41 measures the diameter of single crystal 13. A processor such as a control unit 43 processes the signals generated by the photocell 39 and the diameter transducer 41. The control unit 43 may be a programmed digital or analog computer; it controls crucible and single crystal drive units 7 and 21, heater power supply 23, the pump 31 and argon flow controller 29.

Figure 2A:
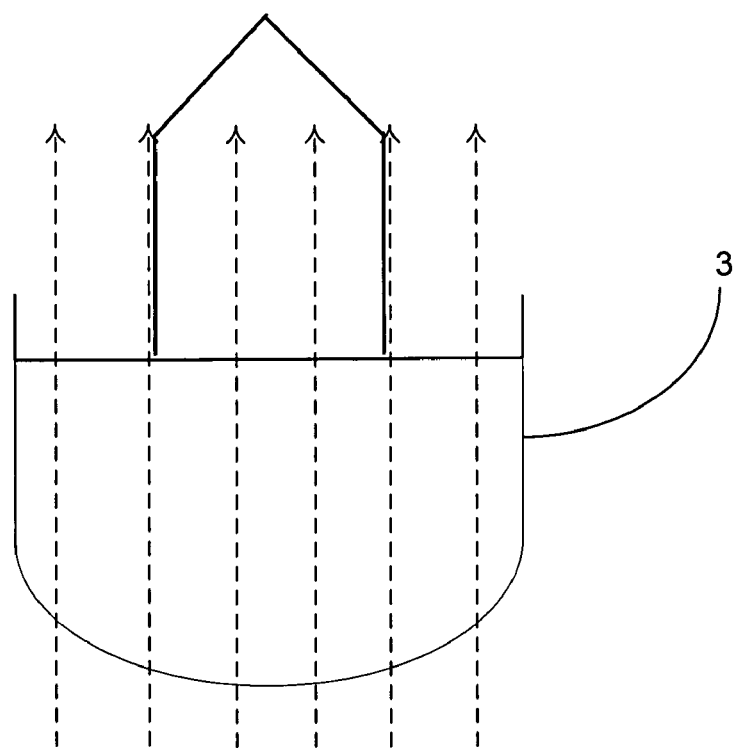
FIG. 2A is a block diagram illustrating an axial magnetic field being applied to a crucible containing a melt in crystal growing apparatus.
Figure 2B:
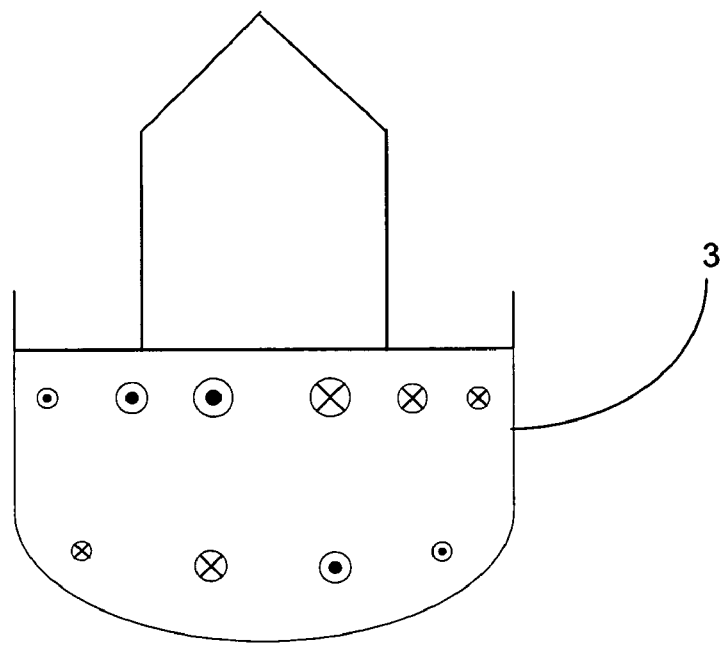
FIG. 2B illustrates the direction of a current induced in the melt for the magnetic field configuration shown in FIG. 2A with the melt flow shown in FIG. 1A.
Figure 3A:
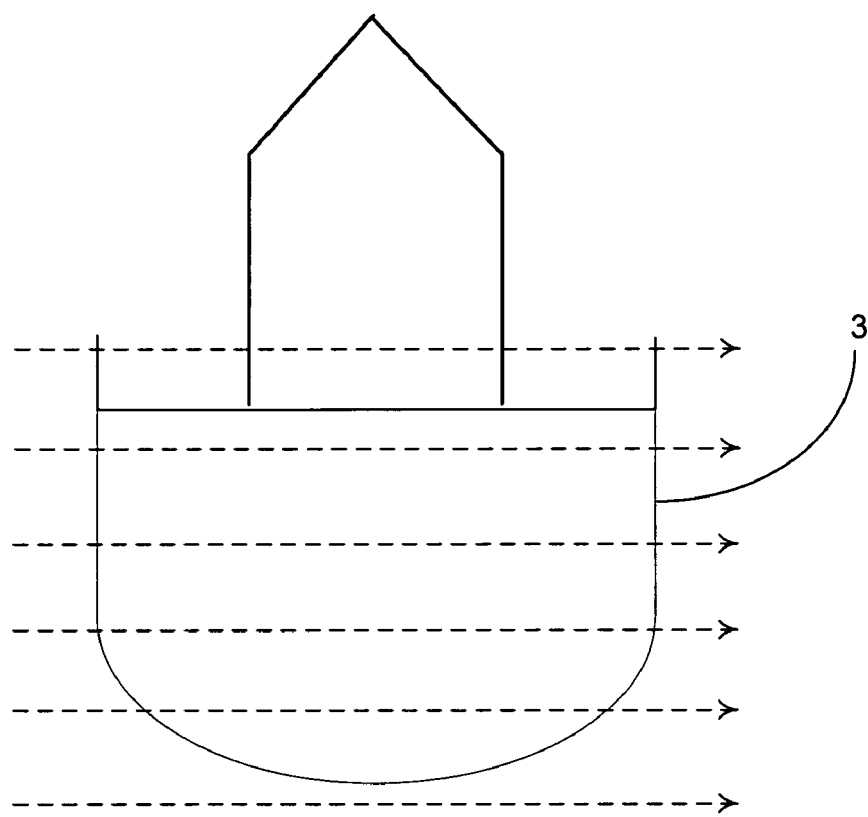
FIG. 3A is a block diagram illustrating a horizontal magnetic field being applied to a crucible containing a melt in crystal growing apparatus.

An upper magnet such as a solenoid coil 45 and a lower magnet such as a solenoid coil 47 are located above and below, respectively, silicon melt level 11. In the illustrated embodiment, the coils 45, 47, shown in cross section, surround the vacuum chamber and share axes with axis of symmetry 19. The upper and lower coils 45, 47 have separate power supplies, namely, an upper coil power supply 49 and a lower coil power supply 51, each of which is controlled by the control unit 43. Current flows in the two solenoids coils 45, 47 and produces a magnetic field. A reservoir 53 provides cooling to the upper and lower coils 45, 47 before draining via the cooling water return manifold 37. A ferrous shield 55 surrounds the upper and lower coils in the illustrated embodiment to reduce stray magnetic field and to enhance the strength of the field produced. The direction and amplitude of the current in coils 45, 47 determine the shape of the magnetic field. For example, when current is being supplied to each of the coils in the same direction (i.e., same polarity), an axial shaped magnetic field is applied to the melt (see FIG. 2A.) In contrast, when current is supplied to the coils in the opposite directions (i.e., opposed polarity) a cusp shaped field is applied to the melt (see FIG. 4A.).

In the crystal pulling process, current flows through coils 45, 47 to impose a magnetic field, having a predetermined strength, upon silicon melt 9 and crucible 3. The predetermined strength can be varied as desired. For example, the strength can be varied as a function of the diameter of crystal 13, the diameter of crucible 3, the amount of the charge, and the desired oxygen content. In general, the magnetic field has a maximum predetermined strength of less than several thousand gauss and may have a maximum predetermined strength of between about 400 and 1000 gauss. As a length of crystal 13 increases (i.e., as the fraction of the molten charge solidified increases), control unit 43 changes the strength of the field by changing the amount of current flowing through the coils (e.g., by controlling upper and lower coil power supplies 49 and 51), by moving the coils relative to crucible 3, or by moving or eliminating a magnetic shielding.

A cusp-shaped magnetic field can be imposed upon melt 9 to regulate the oxygen concentration in the axial and radial directions for single crystal rods of relatively large diameter, particularly at relatively low oxygen concentrations. Current is permeated through the upper and lower coils 45, 47 as indicated (the "." indicating the flow of current out of the page and the "X" indicating the flow of current into the page), thereby causing a magnetic field to be imposed upon crucible 3 and silicon melt 9. The magnetic field has axial and radial components that perpendicularly intersect the bottom and sidewalls of crucible 3. In addition, the magnetic field may have an axial component that perpendicularly intersects silicon melt surface 11. The average magnetic component that perpendicularly intersects molten silicon surface 11 may be small relative to the average magnetic component perpendicularly intersecting the bottom and sidewalls of crucible 3 in contact with the molten silicon.

The control unit 43 having a central processing unit (CPU) 71 and a memory 73 is connected to one or more input/output (I/O) devices (e.g., 39, 41) for receiving an input signal representative of a sensed growth parameter such as temperature of the melt 9 and/or a diameter of the crystal 13. Commonly assigned U.S. Pat. No. 5,178,720, the entire disclosure of which is incorporated herein by reference, discloses a method for controlling crystal and crucible rotation rates as a function of the crystal diameter. Commonly assigned U.S. Pat. No. 5,882,402, U.S. Pat. No. 5,846,318, U.S. Pat. No. 5,665,159, and U.S. Pat. No. 5,653,799, the entire disclosures of which are incorporated herein by reference, provide accurate and reliable measurements of a number of crystal growth parameters, including crystal diameter. In these patents, an image processor processes images of the melt-solid interface to determine the diameter. When the diameter becomes small enough, crystal 13 is then separated from the melt 9.

The memory 73 stores target growth parameter data such as a target diameter, and/or target profile data. Target profile data includes, for example, output current set points for each of the magnet power supplies 49, 51 as a function of crystal length. The upper and lower coils 45, 47 are energized via magnet power supplies 49, 51 to produce a magnetic field having a cusp-shaped magnetic field. An ideal cusped magnetic field has a radial component approximately horizontal at the melt surface and an axial component approximately vertical on the axis of the crystal puller (see FIG. 4A). A cusp-shaped magnetic field is produced by the control unit 43 controlling power supplies 49, 51 to supply currents to the upper and lower coils 45, 47, respectively, that are substantially equal in magnitude and opposite in polarity. For example, control unit 43 generates a cusp-shaped magnetic field by controlling power supply 49 to supply a current having a magnitude of −100 amperes to the upper coil 45 and controlling power supply 51 to supply a current having a magnitude of +100 amperes to the lower coil 47. Notably the "−" and "+" are used to indicate that the currents in the upper and lower coils flow in opposite directions. It is to be understood that in FIG. 7A the details of the of the crystal puller, which includes heater coils 45, 47 and diameter sensor 41 are magnified while other details of the crystal puller shown in FIG. 5 are omitted for clarity.

Upper and lower coils 45 and 47 are made such that when they are operating at the same power distribution (e.g., both at the same percentage of the maximum power input), the cusp position remains at melt level 11 (e.g., the melt-solid interface). The central processing unit (CPU) 71 is responsive to the generated signals, received via links 716, 718, and/or the stored target data to modify the power distributions in upper and lower coils 45, 47 to move the cusp position up or down and to change the relative magnitudes of axial or radial components of the magnetic field. For example, to adjust the radial component of the magnetic field to above or below melt level 11 (e.g., a melt-solid interface), the control unit 43 controls power distribution to increase or decrease, respectively, the axial component of the magnetic field. In other words, the control unit 43 controls the current being supplied to the upper and lower coils from power supplies 49 and 51 to impose a magnetic field having a cusp-shape with a ramping (e.g., increasing or decreasing) axial magnetic field.

Figure 6A:
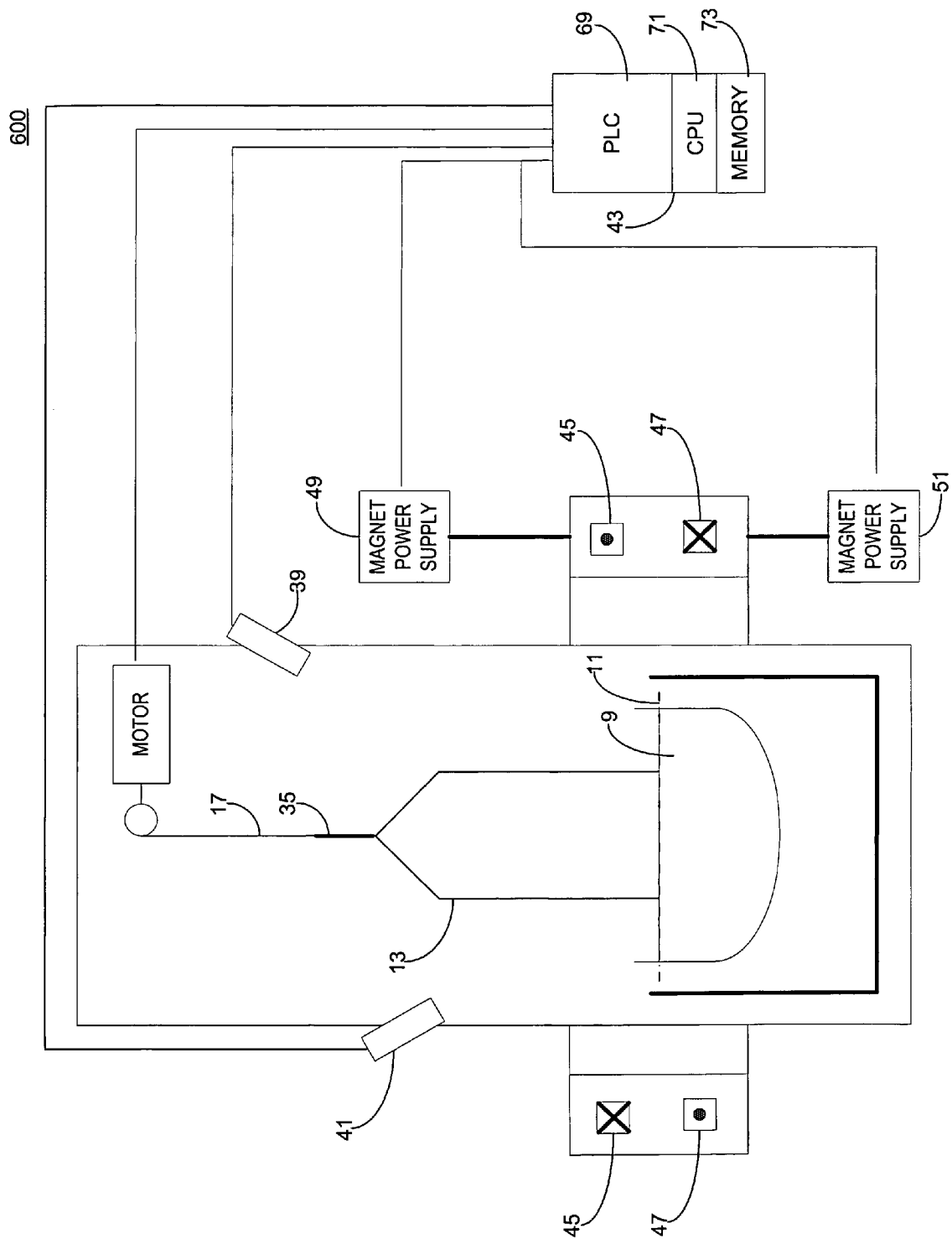
FIG. 6A is a block diagram illustrating components of a crystal growing apparatus control system configured to apply a time-varying magnetic field to generate a pumping force in the melt according to one preferred embodiment of the invention.

Referring now to FIG. 6A, which shows the components of a system 600 for generating a pumping force in the melt in accordance with one preferred embodiment of the invention. The control unit 43 controls the power supplies 49, 51 to change the currents being supplied to the upper and lower coils 45, 47 in the same algebraic direction to achieve a cusp-shaped magnetic field with an increasing axial field component. For example, the control unit 43 controls the upper power supply 49 to increases the amount of current being supplied to the upper coil 45 from about −100 amperes (amps) to about −95 amps (i.e., less negative) and controls the power supply 51 to increase the amount of current being supplied to the lower coil 47 from about +100 amps to about +105 amps. As an alternative example, to achieve a cusp-shaped magnetic field with a decreasing axial field component, the control unit 43 controls power supply 49 to decrease the amount of current being supplied to the upper coil 45 from about −100 amps to about −105 amps (i.e., more negative) and controls power supply 51 to decrease the amount of current being supplied to the lower coil 47 from about +100 amps to about +95 amps. As will be described below, increasing or decreasing the axial component of the magnetic field induces a current in the melt 9. The induced current interacts with the magnetic field being applied to the melt 9 to produce forces in the melt 9 that contribute to or oppose a general rolling motion of the melt which normally results from global thermal convection.

Figure 6B:
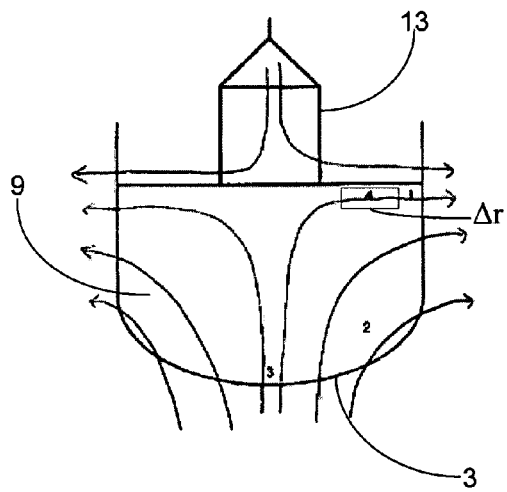
FIGS. 6B-6D illustrate the effects of increasing an axial component of a cusp-shaped magnetic field.
Figure 6C:
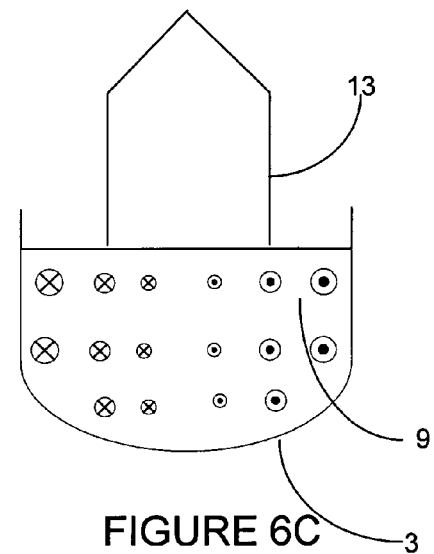
Figure 6D:
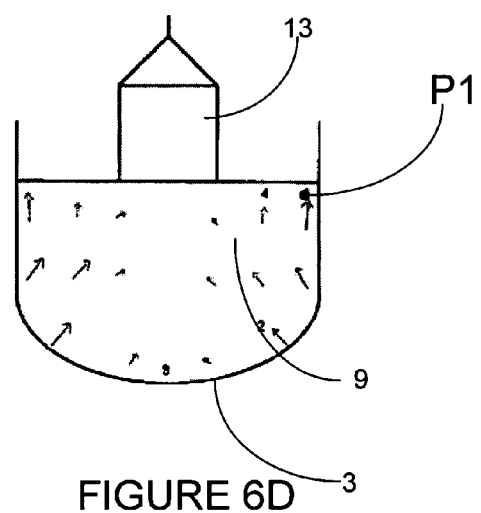

FIGS. 6B-6D illustrate a cusp-shaped magnetic field and the direction of induced currents and forces in a melt when the applied cusp-shaped magnetic field has an increasing axial component. As known to those skilled in the art, both magnitude and direction of an induced current in a conductor can be determined as a function of an induced electric field, and the induced electric field can be determined as a function of a changing magnetic flux resulting from a changing magnetic field B (e.g., increasing axial component) across the crucible area A (see FIG. 6B). Although the axial component can be increased or decreased, for purposes of illustration, the following description of electromagnetic principles assumes the magnetic field has an increasing axial component.

As known to those skilled in the art, for a disk of radius r with a uniform magnetic field normal to the surface of the disk, the magnetic flux can be determined by the following equation:

$$\Phi = \pi r^2 B, \quad (1)$$

and when the axial component of the magnetic field $B_z$ is changing, the change in flux through the area A can be determined by the following equation:

$$d\Phi/dt = A \, dB_z/dt, \quad (2)$$

where $dB_z/dt$ is the rate of change in the axial component of the magnetic field.

An electromotive force (emf) is induced around a path in the plane of the melt level 11 and can be determined by:

$$\mathscr{E} = -d\Phi/dt = -\pi r^2 \, dB_z/dt. \quad (3)$$

Please note that an "X" appearing on the right side of crucible 3 and a corresponding "." appearing on the left side will indicate a counter-clockwise direction as viewed from the top of crucible 3, and an "X" appearing on the left side of crucible 3 and a corresponding "." appearing on the right side will indicate a clockwise direction as viewed from the top of the crucible. In this case, the induced emf produces a current in the clockwise direction (see FIG. 6C). The electric field around the perimeter of a disk of $2 \pi r$ can be determined by the equation $$E_\theta = -r/2 \, dB_z/dt. \quad (4)$$

The current induced in an annular ring of cross sectional area $A_C$ can be determined by the equation:

$$I = J \cdot A_C, \quad (5)$$

where J is the current density. The current density can be calculated using the equation;

$$J = \sigma \cdot E, \quad (6)$$

where σ is the electrical conductivity of the conductive material (e.g., Silicon).

By combining equations (4), (5), and (6), the following equation can be derived and used to calculate the current induced into the melt 9 due to the increasing axial component of the net magnetic field:

$$I = \sigma \, A_C \, (r/2) \, dB_z/dt. \quad (7)$$

When current moves through a conductor in a magnetic field, a force is exerted on the conductor and can be calculated by the following equation:

$$F = I(1 \times B); \quad (8)$$

where $I_\theta$ is the induced current in the θ direction and 1 is the length of the conductor in the direction of the current. Accordingly, when the radial component, $B_r$, of the magnetic field interacts with the induced current in the ring, forces are produced on the ring in the axial direction, $F_z$, and radial direction $F_r$ and can be determined from equations:

$$F_z = -2 \pi r I_\theta B_r, \quad (9)$$

$$F_r = 2 \pi r I_\theta B_z. \quad (10)$$

Application of right-hand rule principles to equations (9) and (10) yields the expected directions of forces generated in the melt 9 (see FIG. 6D). As can be seen from FIG. 6D, an upward force is produced on the ring at point $P_1$. By generating and controlling the direction of such forces in the melt 9, the present invention provides an improved method for controlling the global melt flow pattern in the melt 9, and, thus, control of growth parameters (e.g., diameter, oxygen content) during the silicon ingot manufacturing process.

In this first mode of operation, changes in the velocity of the melt 9 cannot be sustained over a long period of time. For purposes of illustration, consider an upward velocity generated in the melt 9 at $P_1$ as a result of the force generated from an increasing axial field component of a cusp-shaped magnetic field. As known to those skilled in the art, a back emf will also be generated at $P_1$ in response to the upward velocity. In fact, an azimuthal electric field will be generated at $P_1$ and can be calculated by the following equation:

$$E_{back} = v \times B_r, \quad (11)$$

where v is the upward velocity of the melt at $P_1$. When this second electric field, associated with the back-emf, balances the electric field generated by $dB_z/dt$, the steady state velocity v will have been reached. This relationship can be expressed by the following:

$$v \, B_r = r/2 \, dB_z/dt, \quad (12)$$

or $$v = (r/2) \, (dB_z/dt)/B_r. \quad (13)$$

As can be seen from the example described in Appendix A, the time t required to achieve a steady state velocity in the melt 9 as a result of the induced electric field is inversely proportional to the square of the radial component of the magnetic field (i.e., $B_r^2$.) The steady state velocity is proportional to the derivative of the axial component $B_z$ of the magnetic field with respect to time and inversely proportional to $B_r$. From Appendix A it can be seen that the time required to reach the steady state velocity can be determined by the following equation:

$$\Delta t = v/a = \rho/(\sigma \, B_r^2). \quad (14)$$

Accordingly, steady state velocity is reached very quickly. Thus, increasing an axial component of a cusp-shaped magnetic field will produce a change in velocity of the melt flow, but a new steady state velocity will be reached relatively quickly.

Referring back to FIG. 6A, in this embodiment, control unit 43 is configured as an open loop control system and generates the pumping force in the melt for a limited period of time to achieve a desired effect on one or more growth parameters in the growing crystal 13. During operation, the I/O device 41 senses a growth parameter such as a diameter of the silicon crystal, and generates an output signal representative of the sensed diameter. The control unit 43 converts the received output signal to a sensed diameter value and calculates a difference between the sensed diameter value and a target diameter value. If the calculated difference exceeds a threshold value (e.g., 0.5%), the control unit 43 then changes the relative magnitudes of each of the currents being supplied to the upper and lower coils 45, 47 by a predetermined amount to increase or decrease the velocity of the melt flow resulting from global thermal convection, and, thus increase or decrease the diameter of the crystal. For example, if the sensed diameter is greater than the target diameter and the calculated difference exceeds the threshold value, the control unit 43 controls the power supplies 49, 51 to increase the magnitude of currents being supplied to each of the upper and lower coils 45, 47 by a predetermined amount (e.g., +5 amperes) to achieve a cusp-shaped magnetic field with an increasing axial field component. As described above, a cusp-shaped magnetic field with an increasing axial field component generates forces in the melt that increase the velocity of the melt flowing toward the crystal-melt interface, and, thus, decrease the diameter of the crystal at the crystal-melt interface. As an alternative example, if the sensed diameter is less than the target diameter and the calculated difference exceeds the threshold value, the control unit 43 controls the power supplies 49, 51 to decrease the relative magnitude of currents being supplied to each of the upper and lower coils 45, 47 by a predetermined amount (e.g., −5 amperes) to achieve a cusp-shaped magnetic field with a decreasing axial field component. A cusp-shaped magnetic field with a decreasing axial field component generates forces in the melt that decrease the velocity of the melt flowing toward the crystal-melt interface, and, thus, increase the diameter of the crystal at the crystal-melt interface. Although the growth parameter is described above as being a diameter, it is to be understood that the invention contemplates generating the pumping forces in the melt to affecting other growth parameters that can be sensed during processing (e.g., temperature and interface height).

In one embodiment, the control unit 43 calculates the difference between the sensed diameter value and a target diameter value at predetermined intervals along the length of the crystal 13, and increases or decreases, as necessary, the magnitude of each of the currents being supplied to the upper and lower coils 45, 47 by the predetermined amount. In other words, the process will be repeated during the pulling process whenever the calculated difference between the sensed diameter value and a target diameter value indicates an actual difference greater than the threshold value.

Referring now to FIG. 7A, the components of a system 700 for generating a steady state pumping force in the melt are shown in accordance with another preferred embodiment of the invention. In this embodiment, rather than changing the relative magnitudes of the currents being supplied to the upper and lower coils 45, 47, the control unit 43 controls the power supplies 49, 51 to change the relative phase difference between alternating current signals being supplied to the upper and lower coils 45, 47 to achieve a cusp-shaped magnetic field with cycling cusp and axial field components. Notably, there is a limit to the amount that currents being supplied to the coils 45, 47 can be increased or decreased, but the phase of an alternating current can be changed indefinitely if so desired. As explained below, cycling the cusp and axial field components of the magnetic field induce currents in the melt which interact with the magnetic field being applied to the melt 9 to produce time-averaged steady state pumping forces in the melt 9 that contribute to or oppose a general rolling motion of the melt which normally results from global thermal convection. For example, a first phase difference between the currents being supplied to the upper and lower coils 45, 47, produces forces in the melt that contribute to the general rolling motion, and a second phase difference between the currents being supplied to the upper and lower coils 45, 47, produces forces in the melt that oppose the general rolling motion.

Figure 7B:
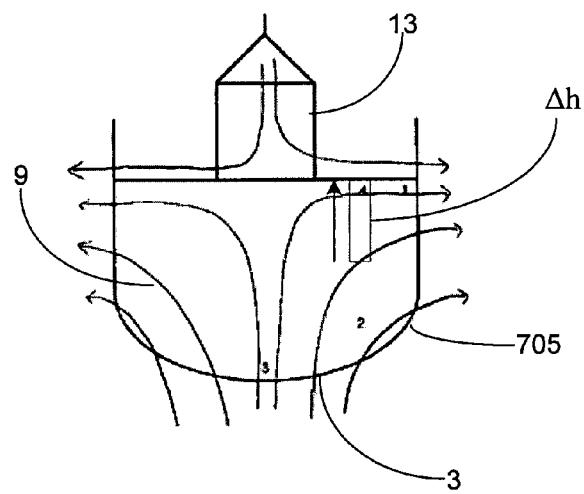
FIGS. 7B-7D illustrate the effects of increasing a radial component of a cusp-shaped magnetic field.
Figure 7C:
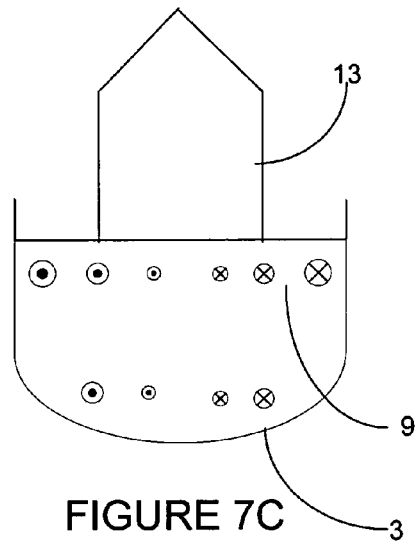
Figure 7D:
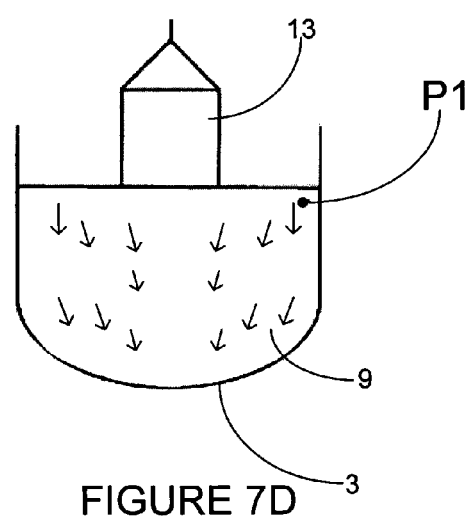

FIGS. 7B-7D illustrate a cusp-shaped magnetic field and the direction of induced currents and forces in a melt when the applied cusp-shaped magnetic field has an increasing radial component. Although the radial component can be increased or decreased, for purposes of illustration, the following description of electromagnetic principles assumes the magnetic field has an increasing radial component.

From equation (1) above, it can be seen that when the radial component $B_r$ of the magnetic field is changing, the change in flux can be determined by the equation:

$$d\Phi/dt = A\, dB_r/dt, \quad (15)$$

To simplify the analysis, assume that $B_r$ varies linearly from the tangent point 705 to the surface 11 of melt 9, over a height $\Delta h$ (See FIG. 7B). Thus, the average value of $B_r$ over the distance $\Delta h$ is $B_r/2$, and the total flux is determined by:

$$\Phi = 2\pi\, r\, \Delta h\, B_r/2, \quad (16)$$

From equation (3) above it can seen that the total emf induced is:

$$\mathscr{E} = -d\Phi/dt = -\pi\, r\, \Delta h\, dB_r/dt. \quad (17)$$

This total emf is produced around the perimeter of the surface enclosing the changing flux. Since at the border boundary of the surface, i.e., tangent point 705, the field is parallel to the crucible wall, there is no change in the flux at that boundary so the emf around the bottom boundary is zero (0). There is no net emf on the side walls of the crucible 3, so the total emf must be induced at the top surface. As described above, an induced emf produces a current in the conductor. In this case, the current is produced in a counter-clockwise direction (see FIG. 7C). Since the emf is induced at the perimeter $2\pi r$, the electric field can be determined by:

$$E_\theta = (\Delta h/2)\, dB_r/dt \quad (18)$$

The radial component of the magnetic field, $B_r$, interacts with the induced current in the ring to produce a downward force on the ring at $P_1$ that can be determined from the equation:

$$F_z = 2\pi\, r\, I \times B_r. \quad (19)$$

Application of right-hand rule principles to equation (19) yields the expected directions of forces generated in the melt (see FIG. 7D). A comparison of equations (4) and (18) reveals the similarity between the electric field resulting from a changing axial component of the magnetic field (i.e., $E_\theta = -r/2\, dB_z/dt$) and the electric field resulting from a changing radial component of the magnetic field (i.e., $E_\theta = (\Delta h/2)\, dB_r/dt$) for the same cusp field background. Moreover, since $r$ and $\Delta h$ are about the same value, the forces will be very similar.

If the radial and axial components of the fields are changing simultaneously, the total (net) electric field in the counter-clockwise direction can be determined from the following equation:

$$E_\theta = -(r/2)\, dB_z/dt + (\Delta h/2)\, dB_r/dt. \quad (20)$$

By combining equations (5), (6) and (9) the following force equation can be derived:

$$F_z = -2\pi\, r\, \sigma\, E_\theta\, A_C\, B_r, \quad (21)$$

and incorporating equation (20) yields the following:

$$F_z = \pi\, r\, \sigma\, A_C\, B_r\, [r\cdot dB_z/dt - \Delta h\cdot dB_r/dt], \quad (22)$$

Thus, if both fields are changing, the total force being generated at a particular point in melt 9 (e.g., $P_1$) corresponds to the sum of the force produced by changing axial component and the force produced by changing radial component. In this case, cycling the $B_r$ and $B_z$ components can be achieved by applying alternating currents to each of the upper and lower coils, 45, 47. Notably, cycling $B_r$ and $B_z$ in phase will produce an oscillating force with no net time average, and thus will have no net effect on the melt flow. However, cycling $B_r$ and $B_z$ out of phase (e.g., $\delta=\pi/2$) allows the application of an azimuthally symmetric force, either upward or downward, near the wall of the crucible that can be sustained indefinitely. For example, consider a cycling radial component of a magnetic field at $P_1$ defined by the following equation:

$$B_r = B_{ro} + \Delta B_r \sin \omega t; \quad (23)$$

where $B_{ro}$ is the quiescent radial component of the magnetic field. Further consider a cycling axial component of a magnetic field at P1 defined by the following equation:

$$B_z = B_{zo} + \Delta B_z \cos \omega t. \quad (24)$$

Notably, $B_{zo}$ is the quiescent axial component of the magnetic field and is equal to zero(0) at $P_1$.

Accordingly, by combining equations (22), (23) and (24) the following equation can be derived to determine the force exerted on the annular ring at $P_1$:

$$F = \pi \, r \, \sigma \, A_C \, [B_{ro} + \Delta B_r \sin \omega t] \, [-r \, \omega \Delta B_z \sin \omega t - \Delta h \, \omega \, \Delta B_r \cos \omega t], \quad (25)$$

which, in the alternative, can be expressed as:

$$F = -\pi \, r \, \sigma \, A_C \, \omega \, \{B_{ro} \, [r \, \Delta B_z \sin \omega t + \Delta h \, \Delta B_r \cos \omega t] + \Delta B_r \, [r \, \Delta B_z \sin^2 \omega t + \Delta h \, \Delta B_r \sin \omega t \cos \omega t]\} \quad (26)$$

By calculating the time average (i.e., long-term average) of the force F, it can be seen that only the $\sin^2 \omega t$ term contributes, and since the time average of $\sin^2 \omega t$ is ½, the average force can be expressed as:

$$F_{av} = \tfrac{1}{2}(\pi \, r^2 \, \sigma \, A_C \, \omega) \, \Delta B_r \, \Delta B_z. \quad (27)$$

With the phase difference between the arc components of $B_r$ and $B_z$ chosen (e.g., $\delta=\pi/2$), the force at $P_1$ is downward. However, if the sign of either one of $\Delta B_r$ or $\Delta B_z$ is changed, the relative phases of $B_r$ and $B_z$ are changed and the force will be upward. For example, with the current in the upper coil ($I_U$) leading the current in lower coil ($I_L$) by 90 degrees, there is a net upward force at $P_1$. Alternatively, if the current in the upper coil lags the current in lower coil by 90 degrees there is a net downward force at $P_1$. Accordingly, pumping forces can be generated in either direction in the melt.

Referring again to FIG. 7A, in this embodiment, the control unit 43 controls the upper and lower power supplies 49, 51 to supply alternating current signals to the upper and lower coils 45, 47 such that the radial and axial components of the fields change simultaneously throughout the crystal growing process. Moreover, the control unit 43 changes the phase difference between the current signals being supplied to the upper and lowers coils 45, 47 as a function of a predetermined current profile 74 or recipe to prevent the formation of defects during a crystal growing process. In this embodiment, the current profile 74 defines a target phase difference between currents to be supplied to the upper and lowers coils 45, 47 while pulling the crystal 13 from the melt as a function of the length of the crystal 13. The target current profile is developed, for example, based on growth defect data (e.g., oxygen, growth line deviation, etc.) collected over a period of time from previous crystal runs. By experimentation and/or the use of modeling software, a current profile 74 which substantially reduces the formation of such defects can be identified. For example, assume 24 amperes of alternating current, each at a frequency of 0.25 hertz, is being supplied to the upper and lower coils 45, 47, respectively, superimposed on quiescent currents which produce a cusp-shaped magnetic field the current profile may define the relative phase difference between upper and lower currents ($I_U$, $I_L$) as a function of crystal lenght as shown in Table 1.

TABLE 1

| CRYSTAL LENTGH FROM SHOULDER | PHASE DIFFERENCE BETWEEN $I_U$ AND $I_L$ |
| --- | --- |
| 96 MM | 270° |
| 134 MM | 315° |
| 172 MM | 0° |
| 210 MM | 45° |
| 248 MM | 90° |
| 286 MM | 135° |
| 324 MM | 180° |
| 362 MM | 225° |
| 400 MM | 270° |

PLC 69 receives input signals from a crystal drive 702 unit that pulls the crystal from the melt 13. The details of construction of crystal drive unit 702 are well known to those of ordinary skill in the art. Generally, the drive unit 702 includes a motor 704 coupled to a drum 706. A dashed line 708 indicates the mechanical coupling between a shaft 710 of the motor 704 and drum 706. Although this mechanical coupling may comprise a direct connection between shaft 710 and drum 706, a preferred arrangement positions a set of reduction gears (not shown) between shaft 706 and drum 706 for better control and smoother operation. Motor 704 is thus operable to let out and reel in cable 17 via drum 706 for lowering seed crystal 35 into melt 9 and for pulling the ingot 13 from melt 11. An encoder 714 such as a 500 pulse per revolution (ppr) encoder provides input signals via lines 716 and 718 to the PLC 69. The encoder 714 is coupled to the shaft 710 for producing a position signal. In this instance, the position signal is made up of pulses on lines 716 and 718 that vary as a function of the rotational movement of drum 706. PLC 69 thus counts the pulses on lines 716 and 718 to determine exactly how much drum 706 has rotated during any given period of interest. Alternatively, a gearing mechanism (not shown) drives drum 710 and encoder 704 can be coupled to one of the rotating gears in the gearing mechanism. Given that the gear ratios are readily known, the number of rotations of drum 710 can be calculated in a manner similar to that disclosed above. Based on the input signals received via lines 716 and 718, PLC 69 adjusts the relative phase difference between the currents by determining the point along the current profile at which the pull is then occurring. Note for purposes of illustration, Table 1 shows the length of the crystal from the shoulder of the crystal, however, as known to those skilled in the art, the length of the crystal can also be determined from the position of the seed 15 during the pull.

Figure 8:
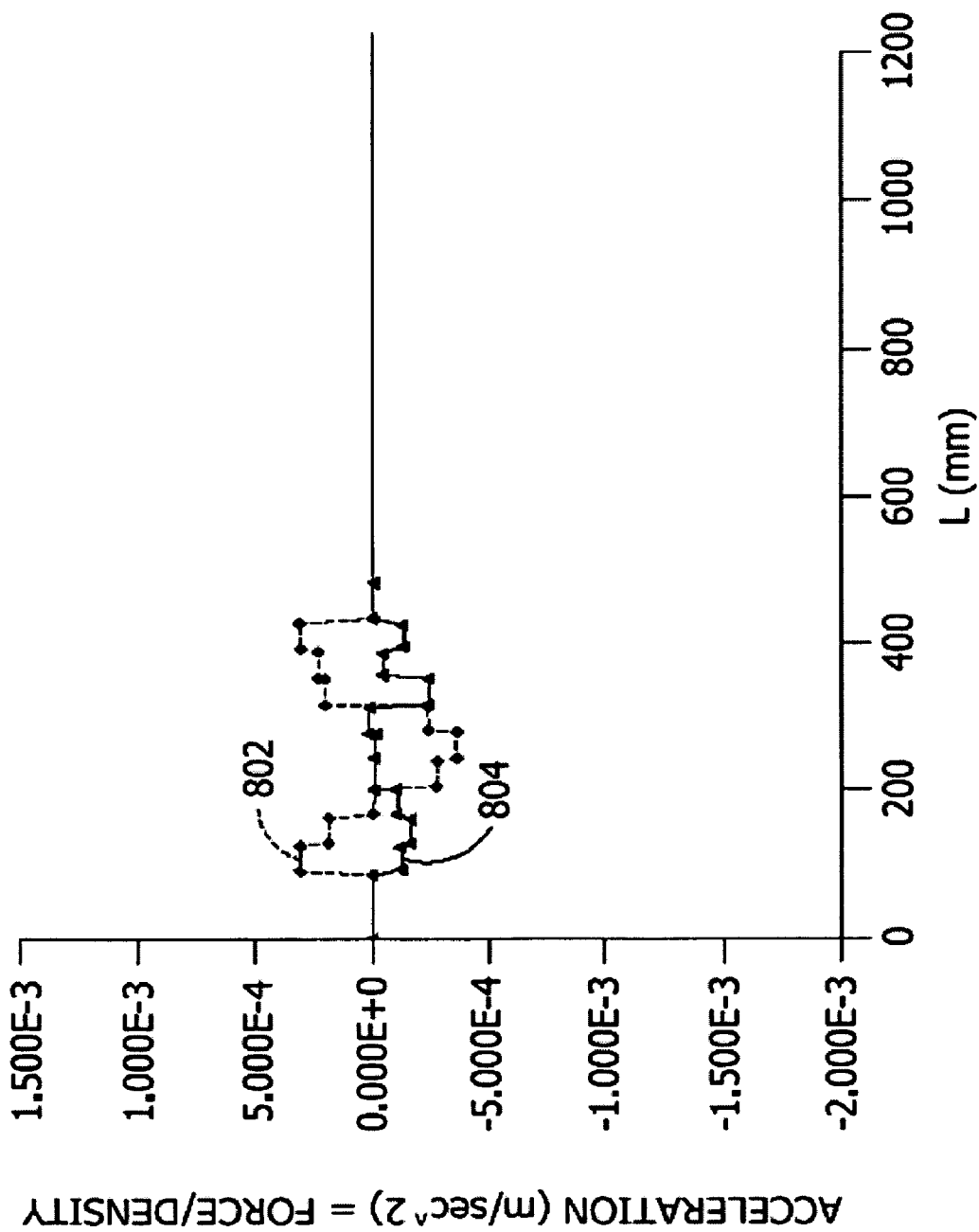
FIG. 8 is an exemplary graph illustrating forces generated in the melt as function of crystal length according to an exemplary current profile.

Referring to FIG. 8, an exemplary graph illustrates forces generated in the melt as a function of crystal length according to the current profile defined in Table 1. Note that, for purposes of illustration, the forces shown in FIG. 8 represent time averaged forces, and the magnitudes of the forces plotted along the vertical axis are expressed as acceleration and can be converted to force per unit volume by multiplying by the density of the melt without affecting the relative shape of the illustrated curves. While the simplified analysis above (for point P1) illustrates the principles of operation, the forces acting upon the melt will vary in magnitude and direction at different points in the melt. These forces can be calculated using numerical simulations to understand the radial and axial forces acting throughout the melt. While the forces vary instantaneously within each cycle of the alternating current supplied to the coils 45 and 47, the time-averaged forces, as calculated in equation (27), are the relevant ones for determining the average effect upon melt flow. The force per unit volume, divided by the density, is equal to the acceleration that would be produced if all other forces were balanced out, and the axial and radial components of this equivalent acceleration, at the point in the melt where the force is largest, is plotted in FIG. 8. The point in the melt where the force is largest is generally near the outer circumference of the melt, at an axial location depending upon the relative phase of the alternating current in the two coils. Plotting the acceleration facilitates comparison with other effects such as buoyancy and gravity.

At the beginning of the crystal pulling process no alternating current signals are supplied to the upper and lower coils 45, 47. After approximately 96 mm of crystal has been pulled from the melt, the control unit 43 causes alternating current signals to be applied to coils 45, 47 with the relative phase difference such that the current in the upper coil leads current in the lower coil by approximate 270 degrees. At this point, the time averaged force in the z-direction, $F_z$, as indicated by line 802, is greater than the time average force in the r-direction, $F_r$ as indicated by line 804. As a result, a net upward and slightly inward force is produced in the melt. After approximately 134 mm of crystal has been pulled from the melt, the control unit 43 adjusts the relative phase difference such that the current in the upper coil leads the current in the lower coil by approximate 315 degrees, and after approximately 172 mm and the control unit 43 changes the relative phase difference such that the current in the upper coil and current in the lower coil are in phase (i.e., current in the upper coil leads the current in the lower coil by approximate 0 degrees.) From line 802 and line 804, it can be seen that $F_z$ remains greater than the $F_r$ 804 at 134 mm length and that net upward and inward forces will continue to be produced from 134 mm to 172 mm. However, it is also apparent that the net upward force produced at the 134 mm length is less than the net upward force produced at the 96 mm length, while the net inward force increases at the 134 mm length, and that the net upward force produced at the 172 mm length is approximately 0, while the inward force still exists. After approximately 210 mm of crystal has been pulled from the melt, the control unit 43 changes the relative phase difference between the currents in the upper and lower coils to approximately 45 degrees. From line 802 and line 804, it can be seen that $F_z$ is now negative, while $F_r$ is still inward, and that generally downward and inward forces will be produced at this length. After approximately 248 mm of crystal has been pulled from the melt, the control unit 43 changes the relative phase difference between the currents in the upper and lower coils to approximately 90 degrees, and after approximately 286 mm the control unit 43 changes the relative phase difference between the currents in the upper and lower coils to approximately 135 degrees. From line 802 and line 804, it can be seen that $F_z$ remains negative while $F_r$ is approximately 0 at the 248 mm and 286 mm lengths and that nearly purely downward forces will be produced at these lengths. After approximately 324 mm of crystal has been pulled from the melt, the control unit 43 changes the relative phase difference between the currents in the upper and lower coils to approximately 180 degrees. From lines 802 and 804, it can be seen that $F_z$ and $F_r$ are relative equal in magnitude at the 324 mm length, and as a result the net force produced at this length is upward and inward at about 45 degrees. After approximately 362 mm of crystal has been pulled from the melt, the control unit 43 changes the relative phase difference between the currents in the upper and lower coils to approximately 225 degrees. From lines 802 and 804, it can be seen that $F_z$ is substantially greater than $F_r$ so the net force is nearly straight upward. After approximately 400 mm of crystal has been pulled from the melt, the control unit 43 changes the relative phase difference between the currents in the upper and lower coils to approximately 270 degrees, duplicating the conditions established after 96 mm of growth. From lines 802 and 804, it can be seen that $F_z$ and $F_r$ are the same as they were at 96 mm of growth. After approximately 438 mm of crystal has been pulled from the melt, the control unit 43 causes the amplitude of the alternating current supplied to the coils to be reduced to 0.

Figure 9:
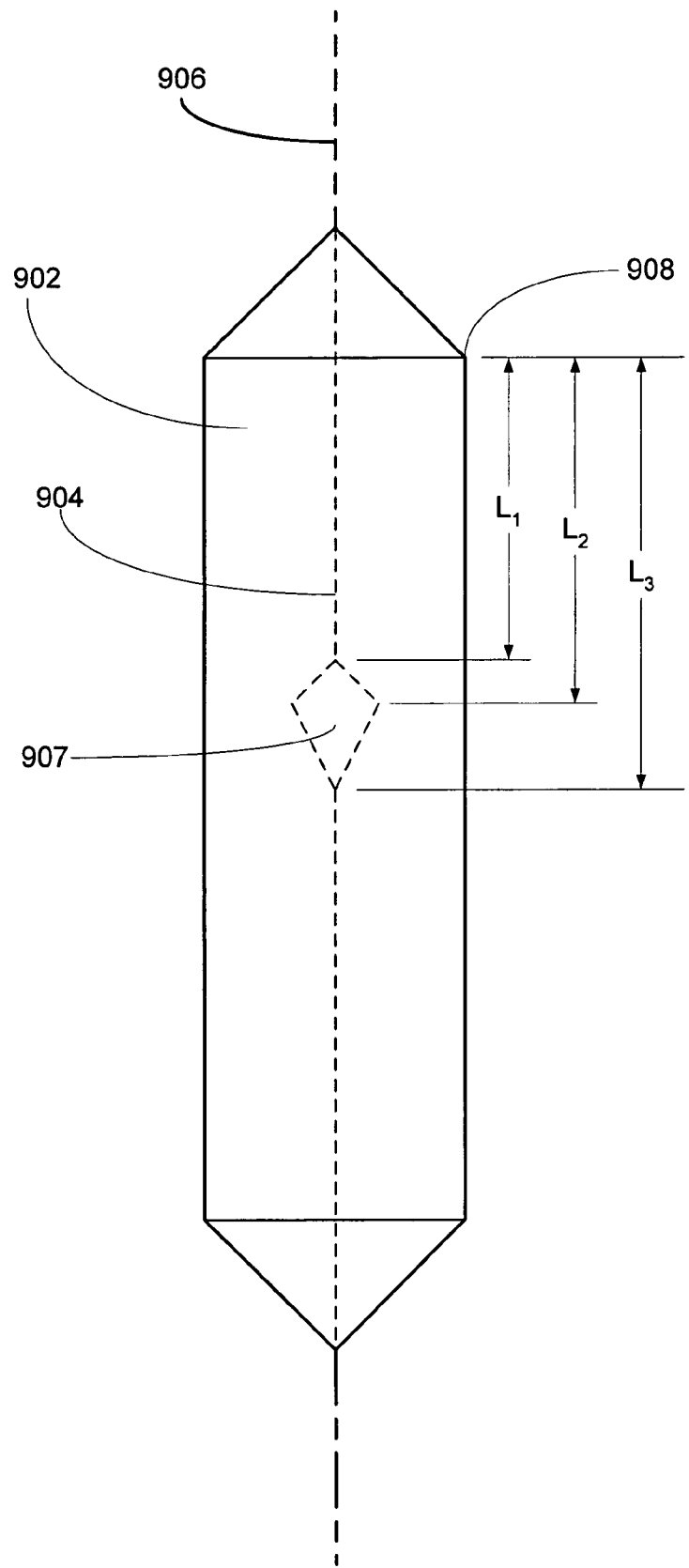
FIG. 9 is a profile view of a crystal illustrating the effect on a growth line on the crystal by adjusting the phase difference between currents being supplied to upper and lower coils in the crystal growing apparatus.

Referring now to FIG. 9, a profile view of a crystal 902 illustrates the effect on a growth line 904 of a crystal 902 when the phase difference between the upper and lower currents $I_U$, $I_L$ is adjusted according to the target profile in Table 1. In general, growth lines 904, or habit lines, appear as bump-like features that occur where major crystallographic planes intersect at the surface of crystal 902, and are generally parallel to vertical axis 906 and spaced apart along the body of crystal 902. As long as the growth line remains substantially straight and parallel to the vertical axis 906, the crystal is known to have zero dislocations, and the radial temperature gradient at the perimeter of the growth interface is sufficient to support the growth of a substantially round crystal. A broadening of the growth lines 904 may appear as a facet 907 and may indicate a loss in zero dislocation or a change in the radial temperature gradient at the perimeter of the growth interface, or both. By adjusting the phase difference between the upper and lower currents, detected deviations in growth lines can be corrected. For example, at a distance $L_1$ from the shoulder of the crsytal 908, the phase difference between $I_U$ and $I_L$ is adjusted to approximately 45 degrees at which point a facet 907 forms. The facet 907 continues to widen until a distance $L_2$ from the shoulder 908 at which point the phase difference between $I_U$ and $I_L$ is changed to 90 degrees. At a distance $L_3$ from the shoulder 908, the phase difference between $I_U$ and $I_L$ is changed to approximately 180 degrees and the facet 907 disappears. Referring to Table 1, it can be seen that L1, L2, and L3, correspond 210, 248, and 324 mm, respectively. Referring to FIG. 8, it can be seen that the widening of the growth facet occurs when the force on the melt is largest and predominantly downward near the perimeter of the melt. According, the present invention advantageously controls silicon crystal growth to correct the formation of defects and crystal irregularities such as facets by controlling the phase difference between the currents being supplied to the upper and lower coils 45, 47.

Figure 10:
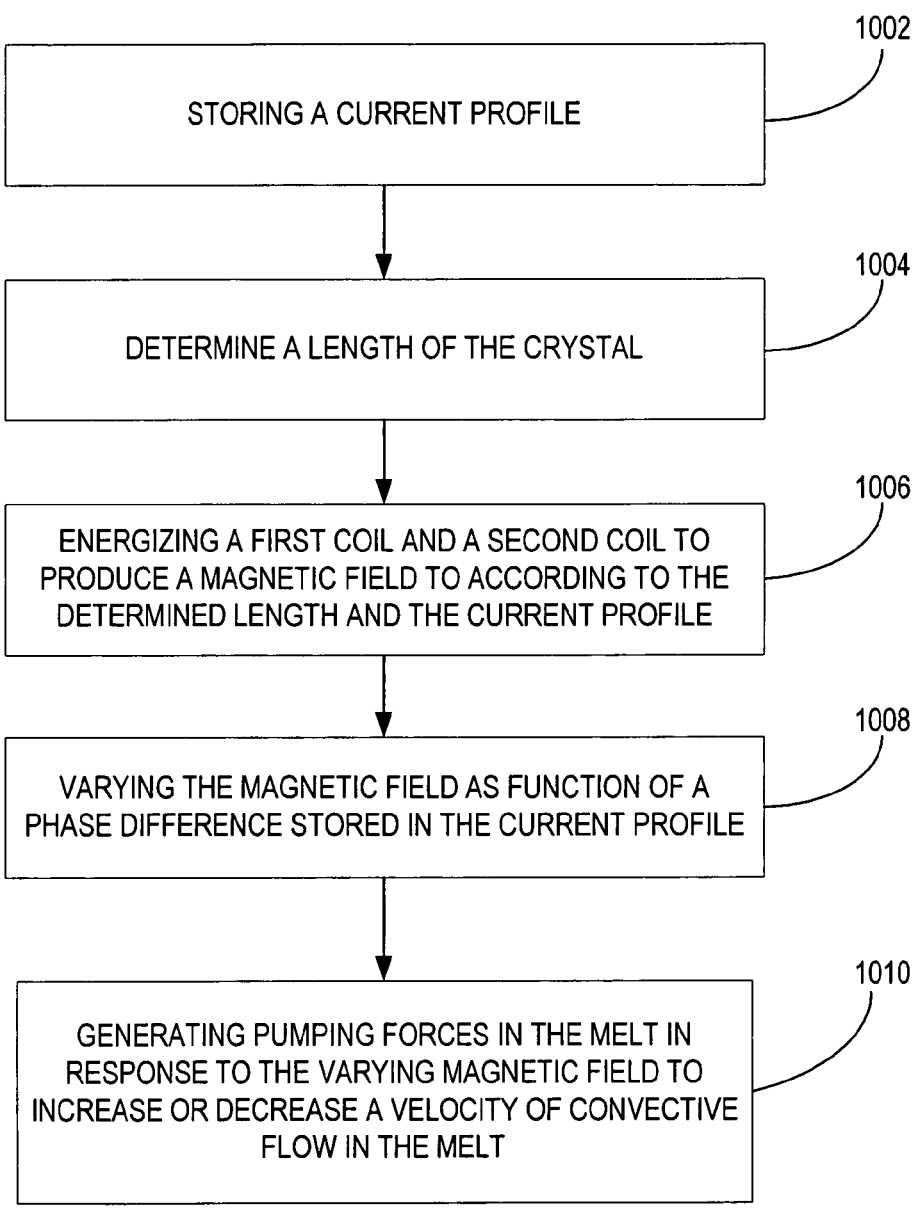
FIG. 10 is a flow diagram illustrating the operation of the system of FIG. 7A for changing a velocity of convective flow in a melt.

Referring now to FIG. 10, an exemplary flow chart illustrates a method for changing a velocity of convective flow in a melt according to the system 700 shown in FIG. 7A. At 1002, a current profile is stored in the memory 74. The stored profile 74 defines first and second currents for energizing the first and second coils 45, 47, respectively, as a function of a length of the crystal 13. The currents are, for example, alternating current signals each having a frequency of approximately 0.25 Hertz and each having a magnitude of about 24 amperes. The current length of the crystal is determined at 1004. The first and second coils 45, 47 are energized by the first current and second current, respectively according to the determined length and the current profile 74 to produce a magnetic field to apply to the melt at 1006. At 1008, the magnetic field is varied as a function of a phase difference between the first and second currents as defined by the current profile 74 to produce pumping forces in the melt that will either increase or decrease the velocity of convective flow in the melt at 1010. For example, if the phase difference indicates the first current leads the second current, the pumping forces will be generally downward and will contribute to the velocity of convective flow in the melt at 1010. Alternatively, if the phase difference indicates the first current lags the second current, the pumping forces be generally upward will retard the velocity of convective flow in the melt at 1010.

The order of execution or performance of the methods illustrated and described herein is not essential, unless otherwise specified. That is, it is contemplated by the inventors that elements of the methods may be performed in any order, unless otherwise specified, and that the methods may include more or less elements than those disclosed herein. Moreover, although the invention is described above for use with a silicon melt, it is contemplated that the invention can be used with any other liquid semiconductor.

When introducing elements of the present invention or the embodiments thereof, the articles "a," "an," "the," and "said" are intended to mean that there are one or more of the elements. The terms "comprising," "including," and "having" are intended to be inclusive and mean that there may be additional elements other than the listed elements.

APPENDIX A

The following analysis illustrates the practical effect of a force produced at point $P_1$ in the melt by varying an axial component of the cusped shaped magnetic field.

Suppose the quiescent field is $B_r$=1000 Gauss at point $P_1$ (a reasonable operating point) and the magnet (i.e., coils 45, 47) currents are ramped up together to maintain $B_r$ constant while increasing $B_z$ by 10 Gauss per second. What force should be expected?

Consider an annular ring at the top corner of the melt at point P1. As shown above, an electric field $E_\theta$ will be induced, where $$E_\theta = -r/2 \; dB_z/dt. \quad (A1)$$

This field will produce a current in the melt, with an ohmic drop equal to the induced voltage. The annular ring has a cross-sectional area $A_C$, and the melt has electrical conductivity $\sigma$ and density $\rho$.

The current in the ring is determined as function of current density:

$$I = J\,A = \sigma\,E\,A. \quad (A2)$$

The mass of the ring is determined by:

$$M = 2\pi\,r\,A\,\rho, \quad (A3)$$

and the weight of the ring is:

$$W = 2\pi\,r\,A\,\rho\,g, \quad (A4)$$

where g is gravitational acceleration.

The upward force on the ring is $$F = 2\pi\,r\,I\,B_r, \quad (A5)$$

or $$F = 2\pi\,r\,\sigma\,A\,(r/2)\,dB_z/dt\,B_r, \quad (A6)$$

which produces an initial acceleration of:

$$a = F/M = \sigma\,r/(2\,\rho)\,B_r\,dB_z/dt. \quad (A7)$$

Using the above values indicates a=$8\times10^{-3}$ m/sec$^2$, and comparing the acceleration to gravity yields a/g=$8.17\times10^{-4}$.

Thus, a ramp rate of 10 Gauss per second for $B_z$ produces a relatively small effect on the melt.

Comparison with Thermal Convection Forces:

If $\beta$ is the volume coefficient of thermal expansion of liquid Si, then the buoyant force on some volume of melt at a temperature $\Delta T$ above the background is $$\Delta F = \rho\,\Delta V\,g, \quad (A8)$$

where $\Delta V = \beta\cdot\Delta T\cdot V$ and $\rho = m/V$. Thus, the acceleration would be $$a = (\beta\,\Delta T)\,g. \quad (A9)$$

Thus, to be equal to the above calculated initial acceleration from the ramped $B_z$, $$\Delta T = 8.17\times10^{-4}/\beta. \quad (A10)$$

Assuming a value of $\beta$ equal to $1.4\times10^{-5}$/degree yields:

$$\Delta T = 58 \text{ K}.$$

Thus, the forces produced with fairly slow ramping rates would be comparable to those from thermal convection.

How long would the acceleration continue? A back-emf will be developed as in any "motor." For the location under consideration (point $P_1$ in the melt), an upward velocity v would generate an azimuthal field $E = v\,B_r$. When this field balances the field generated by $dB_z/dt$, a steady state at velocity v will have been reached. This occurs when:

$$v\,B_r = r/2\,dB_z/dt, \quad (A11)$$

or when $$v = (r/2)\,(dB_z/dt)/B_r. \quad (A12)$$

For the values being considered, this occurs when v=$1.5\times10^{-3}$ m/sec. The time to reach this velocity can be calculated by:

$$\Delta t = v/a = \rho/(\sigma\,B_r^2), \quad (A13)$$

which, works out to be $\Delta t$=0.19 sec. (This would actually be the time constant for a velocity change, which approaches the above velocity exponentially).

If $dB_z/dt$ continues for 100 seconds, then $B_z = B_r$ for this example. In 100 seconds, the melt would be displaced 0.15 m. It turns out that this displacement will be determined by the total $\Delta B_z$ allowed, independent of the rate of change of $B_z$. If $B_r$ is reduced by 50%, the time constant would still be less than 1 second, but the velocity should be twice as large, so the displacement would double.

In summary, the steady state velocity is reached very quickly for modestly large cusp fields, and the steady-state velocity scales with $dB_z/dt$ and with $1/B_r$, while the time constant scales with $1/B_r^2$. Accordingly, significantly larger velocity can be achieved with lower fields. This mode allows for fast changes in local melt flow, but the changes can't be sustained over a long time.

APPENDIX B

The following example illustrates the effect of a force produced at point $P_1$ in the melt by varying a radial component of the cusped shaped magnetic field.

Using the general dependencies shown in Appendix A (see equation A11-A13) the affect of varying the radial component of the cusped shaped magnetic field can be determined. An electric field, associated with a back emf will eventually balance the field generated by $dB_r/dt$, and occurs when a steady state velocity v is reached. In other words balancing occurs when:

$$v B_r = h/2 \, dB_r/dt, \quad (B1)$$

or when $$v = (h/2) \, (dB_r/dt)/B_r, \quad (B2)$$

and the time required to reach this velocity can be calculated by:

$$\Delta t = v/a = \rho/(\sigma B_r^2) \quad (B3)$$

Assuming that $B_r=1000$ G initially. If $B_r$ is ramped at a rate of 10 G/second for 100 seconds, $B_r$ will doubled (with $B_z$ still=0) we can see that the force (i.e., $F=2 \pi r I B_r$) will increase with time, eventually doubling. The steady-state velocity will decrease with time, eventually dropping by half, the time constant to approach the velocity will decrease with time, eventually dropping to 25% of the initial time constant.

Conversely $B_r$ can be ramped downward. In this case, the force at point $P_1$ is upward, and the force will decrease with time, eventually ceasing. The steady-state velocity will increase with time, potentially becoming large, but the time constant to approach that velocity will increase, so the melt will not reach the steady-state velocity.

APPENDIX C

Cycling Cusp and Axial Fields Simultaneously

The following example illustrates the practical effect of a force produced at point $P_1$ in the melt by cycling the radial and axial components and of the cusped shaped magnetic field.

The mass of the incremental volume under consideration is:

$$M = 2 \pi r A_C \rho \quad (C1)$$

so the acceleration produced is (see equation 23)

$$F_{av}/M = -(\omega\sigma/4 \rho) \, r \, \Delta B_r \, \Delta B_z \quad (C2)$$

This can be compared with the acceleration in the case of the cusp field with ramping axial field from Appendix A.:

$$a = \sigma r/(2 \rho) \, B_r \, dB_z/dt. \quad (C3)$$

The example used in Appendix A used $a=8\times10^{-3}$ m/sec$^2$ with a steady-state velocity of $v=1.5\times10^{-3}$ m/sec due to the back-emf generated. By combining C2 and C3 the following equation can be derived:

$$\Delta B_r \, \Delta B_z = 2/\omega B_r \, dB_z/dt. \quad (C4)$$

Assume $\omega=2 \pi$ (10 Hz)=$20 \pi$ sec$^{-1}$, $B_r=1000$ G, and $dB_z/dt=10$ G/sec as used Appendix A, then $\Delta B_r \, \Delta B_z = 3.18\times10^{-6}$ T$^2$. If $\Delta B_r = \Delta B_z$, then $\Delta B_r = \Delta B_z = 1.78\times10^{-3}$ T=17.8 G, modulated at 10 Hz. If $\Delta B_r = \Delta B_z = 100$ G, the acceleration would increase to about 0.25 m/sec$^2$.

The inductance of magnet coils would present a limitation on $\omega$. Reducing $\omega$ would allow larger $\Delta B_r$ and $\Delta B_z$ to be achieved, so that would be the direction in which to move to achieve the maximum pumping action.

The invention claimed is:

1. A method of controlling crystal growth in a crystal growing apparatus, said crystal growing apparatus having a heated crucible containing a semiconductor melt from which a monocrystalline ingot is grown according to a Czochralski process, said ingot being grown on a seed crystal pulled from the melt, said method comprising:
    applying a magnetic field to the melt, said magnetic field affecting convection in the melt;
    sensing a growth parameter of the ingot being pulled from the melt;
    comparing the sensed growth parameter to a target growth parameter;
    determining a power adjustment parameter for achieving a desired effect on the growth parameter of the ingot, said desired effect being based on the comparing; and
    varying the magnetic field applied to the melt while the ingot is being pulled from the melt as a function of the determined power adjustment parameter, said varying of the magnetic field producing a pumping force in the melt, wherein said pumping force selectively increases and decreases a velocity of convective flow in the melt to achieve the desired effect on the growth parameter.

2. The method of claim 1 wherein varying the magnetic field includes increasing an axial component of the magnetic field relative to the ingot to produce a pumping force for increasing the velocity of convective flow in the melt.

3. The method of claim 1 wherein varying the magnetic field includes decreasing an axial component of the magnetic field relative to the ingot to produce a pumping force for decreasing the velocity of convective flow in the melt.

4. The method of claim 1 wherein applying the magnetic field comprises energizing a first coil situated higher than a melt-solid interface between the melt and the ingot and energizing a second coil situated lower than the melt-solid interface and wherein varying the magnetic field comprises adjusting current that energizes each of the first and second coils as a function of the determined power adjustment parameter.

5. The method of claim 4 wherein applying the magnetic field to the melt comprises initially supplying currents to the first and second coils that are substantially equal in magnitude and opposite in polarity.

6. The method of claim 4 wherein adjusting the current includes increasing the current being supplied to each of the first and second coils in the same algebraic direction to increase an axial component of the magnetic field relative to the ingot to produce the pumping force that increases the velocity of convective flow in the melt.

7. The method of claim 4 wherein adjusting the current includes decreasing the current being supplied to each of the first and second coils in the same algebraic direction to decrease an axial component of the magnetic field relative to the ingot to produce the pumping force that decreases the velocity of convective flow in the melt.

8. The method of claim 4 wherein sensing the growth parameter includes sensing the diameter of the ingot being pulled from the melt, and wherein the adjusting includes decreasing the current being supplied to each of the first and second coils in the same algebraic direction to produce the pumping force that decreases the velocity of convective flow in the melt when the sensed diameter is less than a target diameter.

9. The method of claim 4 wherein sensing the growth parameter includes sensing the diameter of the ingot being pulled from the melt, and wherein the adjusting includes increasing the current being supplied to each of the first and second coils in the same algebraic direction to produce the pumping force that increases the velocity of convective flow in the melt when the sensed diameter is greater than a target diameter.

10. A method of controlling crystal growth in a crystal growing apparatus, said crystal growing apparatus having a heated crucible containing a semiconductor melt from which a monocrystalline ingot is grown according to a Czochralski process, said crystal growing apparatus also having first and second coils energized with first and second currents, respectively, to generate a magnetic field applied to the melt, said ingot being grown on a seed crystal pulled from the melt, said method comprising:

storing a current profile, said current profile defining a phase difference between the first and second currents as a function of a length of the ingot for selectively increasing and decreasing a velocity of the convective flow in the melt;

energizing the first and second coils with the first and second currents, defined by the current profile to produce a magnetic field applied to the melt; and varying the first and second currents according to the defined phase difference stored in the current profile, said varying the first and second currents causing the magnetic field applied to the melt to produce a pumping force in the melt, said pumping force changing the velocity of convective flow in the melt.

11. The method of claim 10 wherein varying the first and second currents includes cycling an axial and a radial components of the magnetic field relative to the ingot to produce a pumping force for increasing a velocity of convective flow in the melt.

12. The method of claim 10 wherein varying the first and second currents includes cycling axial and radial components of the magnetic field relative to the ingot to produce a pumping force for decreasing a velocity of convective flow in the melt.

13. The method of claim 10 wherein the first coil is situated higher than a melt-solid interface between the melt and the ingot and the second coil is situated lower than the melt-solid interface between the melt and the ingot, and wherein varying the first and second currents comprises adjusting current that energizes each of the first and second coils as a function of the defined phase difference.

14. The method of claim 13 wherein the stored current profile defines the first current having a first phase and the second current having a second phase as a function of ingot length, and wherein varying the first and second currents produces a pumping force that increases the velocity of convective flow in the melt when the first phase leads the second phase, and a pumping force that decreases the velocity of convective flow in the melt when the first phase lags the second phase.

15. The method of claim 10 wherein the first and second currents are each alternating current signals.

16. The method of claim 10 wherein the stored current profile further defines the phase difference between the first and second currents as a function of ingot length to produce the pumping force in the melt for correcting an increase in a width of a growth facet on the surface of a silicon crystal being grown in the crystal growing apparatus.

17. A method for correcting an increase in a width of a growth facet on the surface of a silicon crystal being grown in a crystal growing apparatus, said crystal growing apparatus having a heated crucible containing a semiconductor melt from which a monocrystalline ingot is grown according to a Czochralski process, said crystal growing apparatus also having first and second coils energized to generate a magnetic field applied to the melt, said ingot being grown on a seed crystal pulled from the melt, said method comprising:

storing a current profile, said current profile defining, as a function of ingot length, a first current having a first phase for energizing the first coil and a second current having a second phase for energizing the second coil, said first phase of the first current being out-of-phase with the second phase of the second current for selectively increasing and decreasing a velocity of convective flow in the melt;

energizing the first and second coils with the first and second currents, respectively, defined by the current profile to produce a magnetic field applied to the melt; and varying the first and second currents according to the stored current profile, said varying the first and second currents causing the magnetic field applied to the melt to produce a pumping force in the melt, said pumping force changing the velocity of convective flow in the melt.

18. The method of claim 17 wherein the first coil is situated higher than a melt-solid interface between the melt and the ingot and the second coil is situated lower than the melt-solid interface between the melt and ingot.

19. The method of claim 17 wherein varying the first and second currents produces a pumping force that increases the velocity of convective flow in the melt when the first phase leads the second phase, and a pumping force that decreases the velocity of convective flow in the melt when the first phase lags the second phase.

20. The method of claim 17 wherein the first and second currents are each alternating current signals.

* * * * *